US007528595B2

(12) United States Patent
Long

(10) Patent No.: US 7,528,595 B2

(45) Date of Patent: May 5, 2009

(54) METHOD FOR DETECTING AND CORRECTING WIRING ERRORS IN POWER MONITORING APPLICATIONS

(76) Inventor: Avery Long, 111 Mercedes Dr., Symrna, TN (US) 37167

(*) Notice: Subject to any disclaimer, the term of this patent is extended or adjusted under 35 U.S.C. 154(b) by 293 days.

(21) Appl. No.: 11/434,978

(22) Filed: May 16, 2006

(65) Prior Publication Data

US 2006/0202674 A1 Sep. 14, 2006

Related U.S. Application Data

(62) Division of application No. 10/385,962, filed on Mar. 11, 2003, now Pat. No. 7,078,925.

(51) Int. Cl.
*G01R 7/00* (2006.01)

(52) U.S. Cl. .................................................... 324/141

(58) Field of Classification Search .................. 324/141
See application file for complete search history.

(56) References Cited

U.S. PATENT DOCUMENTS 4,419,619 A * 12/1983 Jindrick et al. .............. 323/257
4,672,555 A 6/1987 Hart et al. ................... 364/483
4,803,635 A 2/1989 Andow ....................... 364/483
4,851,635 A * 7/1989 Farrow ....................... 219/110
5,086,292 A 2/1992 Johnson et al. ............. 340/637
5,168,459 A 12/1992 Hiller .................... 364/724.19
5,302,890 A * 4/1994 McEachern et al. ......... 324/142
5,471,137 A * 11/1995 Briese et al. ............. 324/158.1
5,473,244 A * 12/1995 Libove et al. ............... 324/126
5,606,510 A * 2/1997 Glaser et al. .................. 702/60
5,652,505 A 7/1997 Brune ........................ 324/107
6,112,158 A 8/2000 Bond et al. .................... 702/61
6,377,037 B1 4/2002 Burns et al. ................. 324/142
6,618,684 B1 9/2003 Beroset et al. ................ 702/99
6,657,424 B1 * 12/2003 Voisine et al. ............ 324/76.11
6,870,374 B2 * 3/2005 Perkins et al. .............. 324/551

FOREIGN PATENT DOCUMENTS

EP 0 685 744 5/1995

(Continued)

OTHER PUBLICATIONS

"Powerlogic® Advanced Power Reliability Solutions," Square D Schneider Electric, brochure, 2000, 3 pages.

(Continued)

*Primary Examiner*—Ha Tran T Nguyen
*Assistant Examiner*—Roberto Velez

(57) ABSTRACT

A three-phase monitoring system for detecting and dynamically correcting wiring errors in an electrical circuit. The system includes a voltage divider circuit and a current transformer circuit connected to three voltage channels and three current channels, respectively. Samples of the voltages and currents are held in respective sample and hold circuits, which are provided to an analog multiplexer. The analog multiplexer is controlled by a processor, and is coupled to gain and filter circuitry, sample and hold circuitry, and to an analog-to-digital converter (ADC). The ADC is connected to the processor, which analyzes the power factor for a given voltage/current pair. If the power factor is outside of an expected range, the processor dynamically changes the addresses assigned to the channels such that the data arrives in the processor in an expected sequence.

16 Claims, 3 Drawing Sheets

START 100
STROBE SAMPLE & HOLD 102
GET A FACTOR 104
GET B FACTOR 106
GET C FACTOR 108
COMPUTE POWER 110
IDLE 112

POWER FACTOR 120
SELECT MUX Vx 122
READ A/D Vx 124
SELECT MUX Ix 126
READ A/D Ix 128
CHECK PHASE ANGLE 130
COMPUTE POWER FACTOR 132
EXIT 134

FOREIGN PATENT DOCUMENTS

| | | |
|---|---|---|
| GB | 1 575 148 | 9/1980 |
| WO | WO2004/081588 A3 | 9/2004 |

OTHER PUBLICATIONS

"Powerlogic® Circuit Monitor—Series 2000," Square D Schneider Electric, brochure, 3 pages.

"Powerlogic® Power Meter," Square D Schneider Electric, brochure, 1998, 2 pages.

"Powerlogic® Metering & Monitoring Devices," Square D Schneider Electric, brochure, 2000, 2 pages.

"Powerlogic® Power Monitoring and Control System," Square D Schneider Electric, brochure, 1998, 4 pages.

"Powerlogic® Series 4000 Circuit Monitor," Square D Schneider Electric, brochure, 2000, 3 pages.

"Powerlogic® System Architecture and Application Guide," Data Bulletin, Square D Schneider Electric, May 2000.

Communication Relating to the Results of the Partial International Search for International Application No. PCT/US2004/007030; 2 pages; dated Aug. 23, 2004.

PCT International Search Report for International Application No. PCT/US2004/007030; 6 pages; dated Oct. 20, 2004.

* cited by examiner

METHOD FOR DETECTING AND CORRECTING WIRING ERRORS IN POWER MONITORING APPLICATIONS

RELATED APPLICATIONS

This application is a divisional application of prior application Ser. No. 10/385,962, entitled "Method and Apparatus For Detecting And Correcting Wiring Errors In Power Monitoring Applications," filed Mar. 11, 2003, now U.S. Pat. No. 7,078,925, which is incorporated herein by reference in its entirety.

FIELD OF THE INVENTION

This invention is directed generally to power monitoring, and more particularly to detecting and correcting wiring errors in power monitoring applications using hardware-based dynamic conversion means.

BACKGROUND OF THE INVENTION

Power monitoring systems monitor the flow of electrical power in circuits through a plant or other facility. In the POWERLOGIC® system manufactured by the instant assignee, Square D Company, circuit monitors and power meters are dedicated to power monitoring, while other compatible devices collect additional equipment information from protective relays, circuit breakers, transformer temperature controllers, and panelboards. Electrical data, such as current, power, energy, waveforms, and equipment status, is passed over a data network to one or more personal computers. The personal computers run power monitoring application software that retrieves, stores, organizes, and displays real-time circuit information in simple, usable formats. The information collected and stored in a power monitoring system helps operate a facility more efficiently. The quality of the data depends upon the accuracy of the instrumentation and the usability of the display formats.

The power meter can replace conventional metering devices such as ammeters, voltmeters, and watt-hour meters while providing other capabilities not offered by analogs metering. The power meter's true rms readings reflect non-linear circuit loading more accurately than conventional analogs metering devices. The power meter calculates the neutral current, which can assist in identifying overloaded neutrals due to either unbalanced single phase loads or harmonics. Circuits can be closely monitored for available capacity by keeping track of the peak average demand current.

Permanently installed electrical monitoring equipment is typically installed during a plant shut-down which may only happen once or twice a year. One or more metering devices are typically installed during these shutdowns. Upon re-energizing the electrical distribution equipment in the facility some wiring errors may be found that cannot be corrected until the next shut-down due to cost of taking manufacturing down to correct for these errors. In poly-phase systems, common wiring errors include swapping phases on the voltage and current channels or wiring current phases backwards. For example, the installer may mistakenly connect the phase B voltage line to the phase C voltage line on a meter. Due to the differences in electrical connectors typically used, interchanging current and voltage lines is normally not encountered.

In somewhat more sophisticated or higher-end monitoring systems, a microprocessor-based control system is utilized. In such systems, phase wiring errors may be corrected using software. However, this solution requires more microprocessor processing time as well as at least double the memory requirement. That is, buffers or registers used to take in the raw data from the metering points or monitor input would have to be duplicated by a second buffer or register, in each instance, to transfer the corrected data points under control of the processor. In lower-end metering applications, there is either insufficient processing power, insufficient memory, or both to correct phase wiring errors through software alone. Moreover, the analog circuitry which processes and digitizes the incoming signals is space-consuming.

Therefore, a need exists for a system and method for detecting and correcting wiring errors without having to shut-down the system and without burdening the processor with memory-intensive operations. A need also exists for a power-monitoring system having a reduced circuit board footprint. The present invention satisfies this and other needs.

SUMMARY OF THE INVENTION

Briefly, in accordance with the foregoing, a power-monitoring system that detects and dynamically corrects a wiring error in a poly-phase electrical circuit includes inputs adapted to receive power signals to be monitored, a processor having data inputs correction circuit including an analog multiplexer having inputs coupled to receive the power signals, having outputs coupled to said the inputs of the processor, and having a control input coupled to the processor, and the processor having a control output coupled with the control input to cause representative ones of the power signals to be provided from the outputs of the analog multiplexer to the data inputs of the processor in a determined sequence.

A method for detecting a wiring error in an electrical circuit monitored by a power-monitoring system includes addressing an analog multiplexer under control of a processor to select a first input carrying an analog voltage signal from the electrical circuit monitored by the power-monitoring system, addressing the analog multiplexer to select a second input carrying an analog current signal corresponding to the analog voltage signal, calculating the power factor corresponding to the analog voltage signal and the analog current signal, and comparing the power factor with an expected power factor range.

The above summary of the present invention is not intended to represent each embodiment, or every aspect, of the present invention. This is the purpose of the figures and the detailed description which follow.

BRIEF DESCRIPTION OF THE DRAWINGS

The foregoing and other advantages of the invention will become apparent upon reading the following detailed description and upon reference to the drawings.

Figure 1:
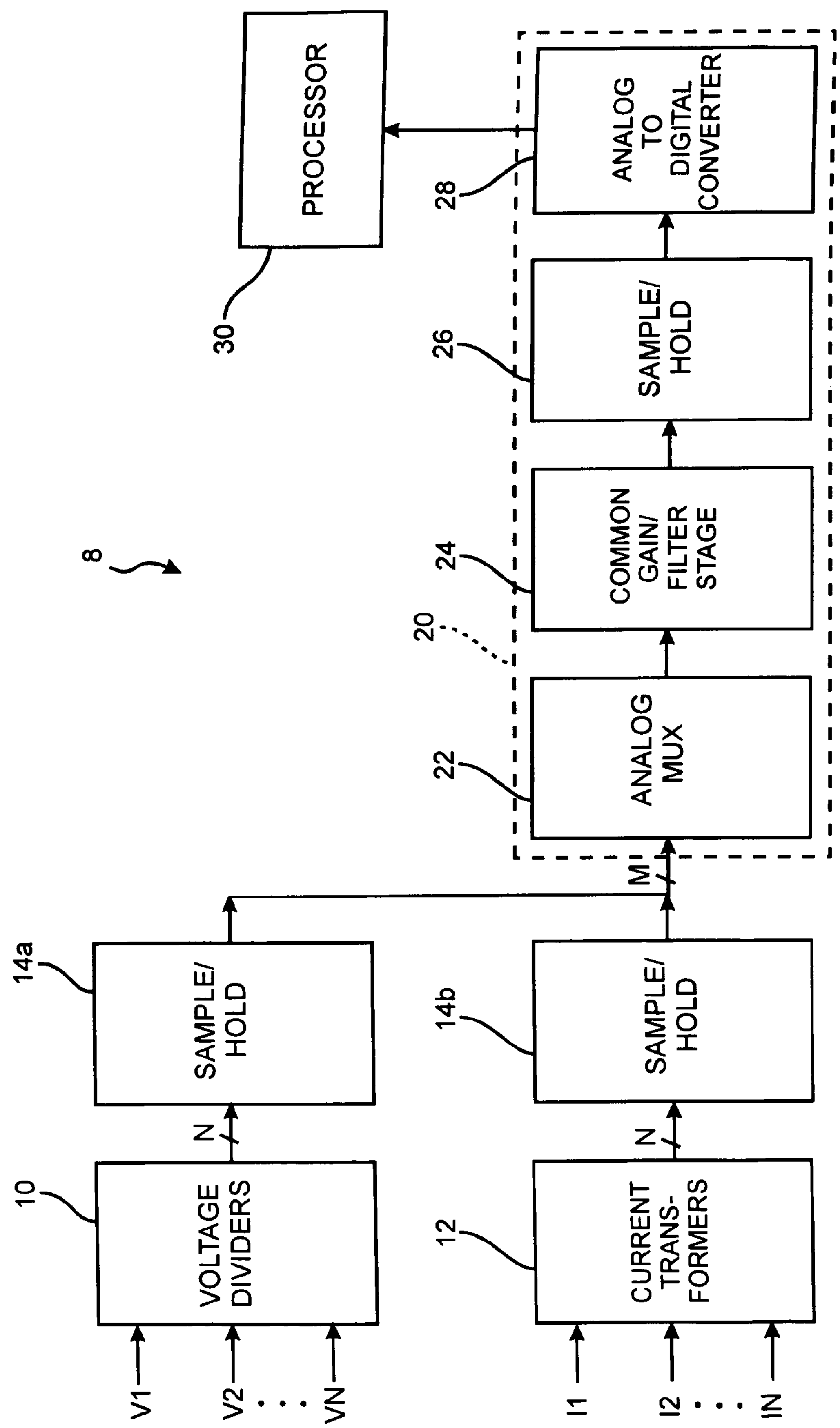
FIG. 1 is a functional block diagram of a poly-phase monitoring system.

While the invention is susceptible to various modifications and alternative forms, specific embodiments have been shown by way of example in the drawing and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENT

The present invention detects and corrects for wiring errors without requiring the electrical equipment to be powered down and rewired. There are at least two common wiring errors that operators can make when connecting electrical equipment to power monitors. One wiring error involves swapping the phases on the current or voltage lines, such as connecting the phase A current line to the phase B current line. When this wiring error occurs, the displacement angles of the respective phases appear in the wrong quadrant. Another wiring error involves wiring up a current phase backwards, such that the current flows backwards with respect to its corresponding voltage phase.

Generally speaking, in a three-phase system, typical power monitors provide one connection or metering point each for each of the three voltage and current phases for a total of six connection points. Heretofore, basic metering devices would yield incorrect readings if the wrong phase is connected to the wrong input, for example, if the phase-B current line is physically connected to the phase-A current line. In such systems, the only way in which to correct the error is to shut down the system and rewire the metering points as noted above.

Referring to the drawings and initially to FIG. 1, there is shown the data paths and principal components of a polyphase monitoring system 8 in accordance with an embodiment of the present invention. The system 8 generally includes voltage dividers 10, current transformers 12, sample and hold circuits 14*a,b*, a correction circuit 20, and a processor 30. The correction circuit 20 includes a multi-channel analog multiplexer 22, a common gain/filter stage 24, a sample and hold circuit 26, and an analog-to-digital converter 28 (ADC).

N voltage lines and N current lines corresponding to 2N lines to be monitored are connected to the voltage disorders 10 and the current transformers 12. As is known, the voltage dividers 10 and current transformers 12 operate to reduce the magnitude of the incoming voltage and current, respectively, to levels appropriate for the sample and hold circuits 14*a, b.*

The voltage dividers 10 and the current transformer 12 are connected to N-way sample and hold circuits 14*a* and 14*b*, respectively. The processor 30 simultaneously strobes each of the sample and hold circuits 14*a,b* in order to obtain voltage and current samples of each input and to preserve the relative phase relationship of all inputs of the sample and hold circuits 14*a,b*.

In the correction circuit 20, the analog multiplexer 22 selects one of the N voltage or current channels for analysis from at least 2N or M number of channels. In a specific embodiment, the analog multiplexer 22 is an 8-channel multiplexer. An optional neutral line (not shown) may also be monitored by the system 8 and coupled to the analog multiplexer 22. Thus, in a three-phase system, 7 channels of the analog multiplexer 22 would be used 3 for each of the 3 voltage channels, 3 for each of the 3 current channels, and one for neutral. Note that in other embodiments, a different number of channels may be multiplexed by the analog multiplexer 22, which may have fewer or more than 8 channels.

The selected channel is provided to the gain/filter stage 24 and the sample and hold circuit 26 and the resulting signal is converted to a representative digital signal by the ADC 28. In an embodiment, the ADC 28 is a 12-bit converter. The converted digitized input is provided to the microprocessor for analysis. While a multi-channel ADC could be used instead of the analog multiplexer 22, the conversion order would be fixed and there would only be a one-to-one mapping of the voltage and current channels. In contrast, the present invention utilizes the sample and hold circuits 14*a* and 14*b* in conjunction with the multi-channel analog multiplexer 22 to dynamically change the conversion order of the channels by changing the successive addresses assigned to the analog multiplexer 22 after the sample and hold circuits 14 have latched the channels, such that the data is always provided to the processor in an expected order.

The analog multiplexer 22 is controlled through software executed by the processor 30, which also controls the conversion order of the ADC 28 to correct for any wiring errors without requiring the system 8 to be rewired. Any wiring errors will be detected by defaulting the conversion sequence to VA, VB, VC, IA, IB, IC or the order expected when the wiring is correct.

The correction circuit 20 may contain discrete elements or in other embodiments may be implemented in an integrated circuit such as the ADC12048 commercially available from National Semiconductor. The integrated circuit replaces numerous analog components, which reduces complexity and circuit-board real estate.

Figure 2:
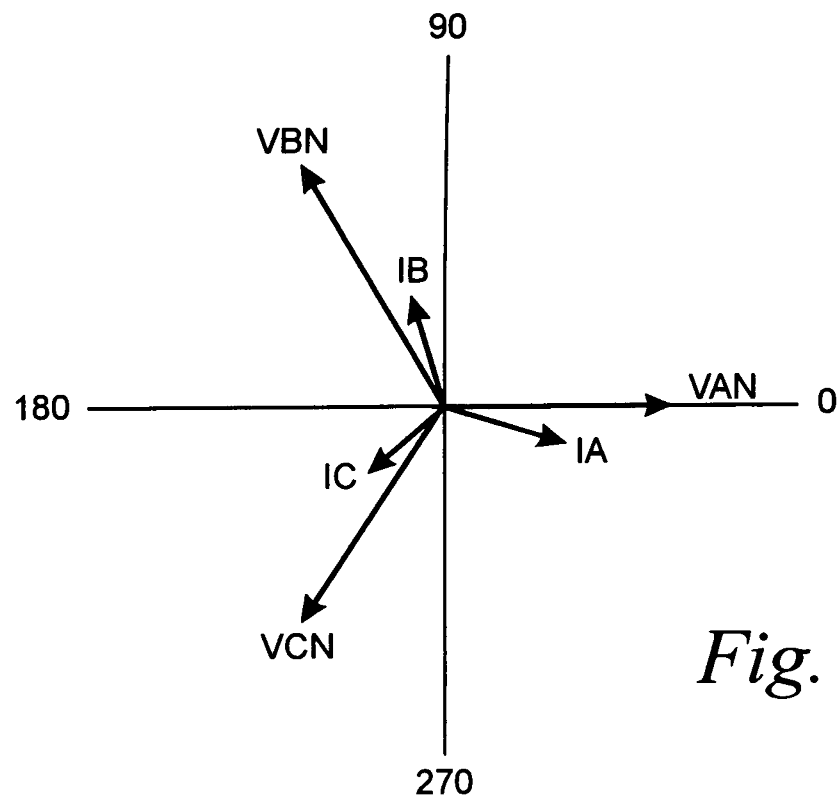
FIG. 2 is a vector diagram of a three-phase power load with all phases in their correct relationship.

FIG. 2 is a vector diagram of an exemplary three-phase power load with the voltage phases VA, VB, and VC shown in proper phase relationship with their corresponding current phases IA, IB, and IC. The power computation of a polyphase circuit is obtained by determining the power factor using a Fast Fourier Transform of each pair, i.e., VA/IA, VB/IB and VC/IC. The expected power factor associated with each phase is assumed to be within certain bounds, normally about 0.5 leading or about 0.8 leading to about 0.5 lagging. When the phases have been wired up incorrectly, one of at least two things can occur. First, one or more of their associated displacement angles appear in the wrong quadrants. Thus, when two voltage lines are swapped, the voltage phase appears 120 degrees out of the expected range. Second, current appears to flow backwards with respect to the voltage in the same phase. Thus, when a current line is wired up backwards, the phase for the current appears 180 degrees out of the expected range. To correct a current phase wired up backwards, the processor 30 is instructed to multiply the value corresponding to the current on the incorrectly wired up phase by −1.

Figure 3:
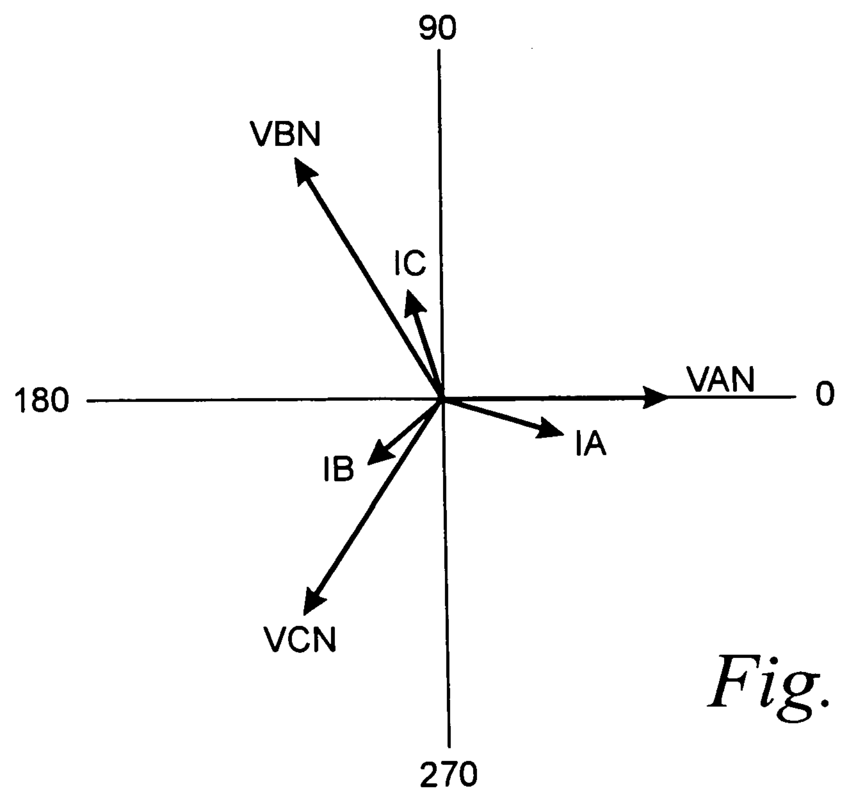
FIG. 3 is a vector diagram of a three-phase power load with two current phases. IB and IC, switched.

FIG. 3 is a vector diagram of a three-phase power load with two current lines, IB and IC, inadvertently switched, i.e., the operator connected the phase-B current line to the phase-C current line. After performing a Fourier transform and analyzing the phase fundamentals of each phase, the processor 30 can determine that the operator has inadvertently switched the IB and IC lines. According to the present invention, for any wiring error in which phases are swapped (such as IB and IC swapped), the A/D conversion sequence for the power factor computation of each voltage/current pair is changed to VA/IA. VB/IC and VC/IB. The analog multiplexer 22, under control of the processor 30, switches the addresses of the incorrectly wired channels so that they appear to the processor 30 in the proper and expected order. The system 8 may inform the operator that a wiring error has been detected and the type of wiring error so that the phases can be wired up correctly during the next planned system shutdown. The present invention avoids costly unplanned system shutdowns to correct wiring errors, and does not require substantial processor bandwidth or expanded memory allocation.

Figure 4:
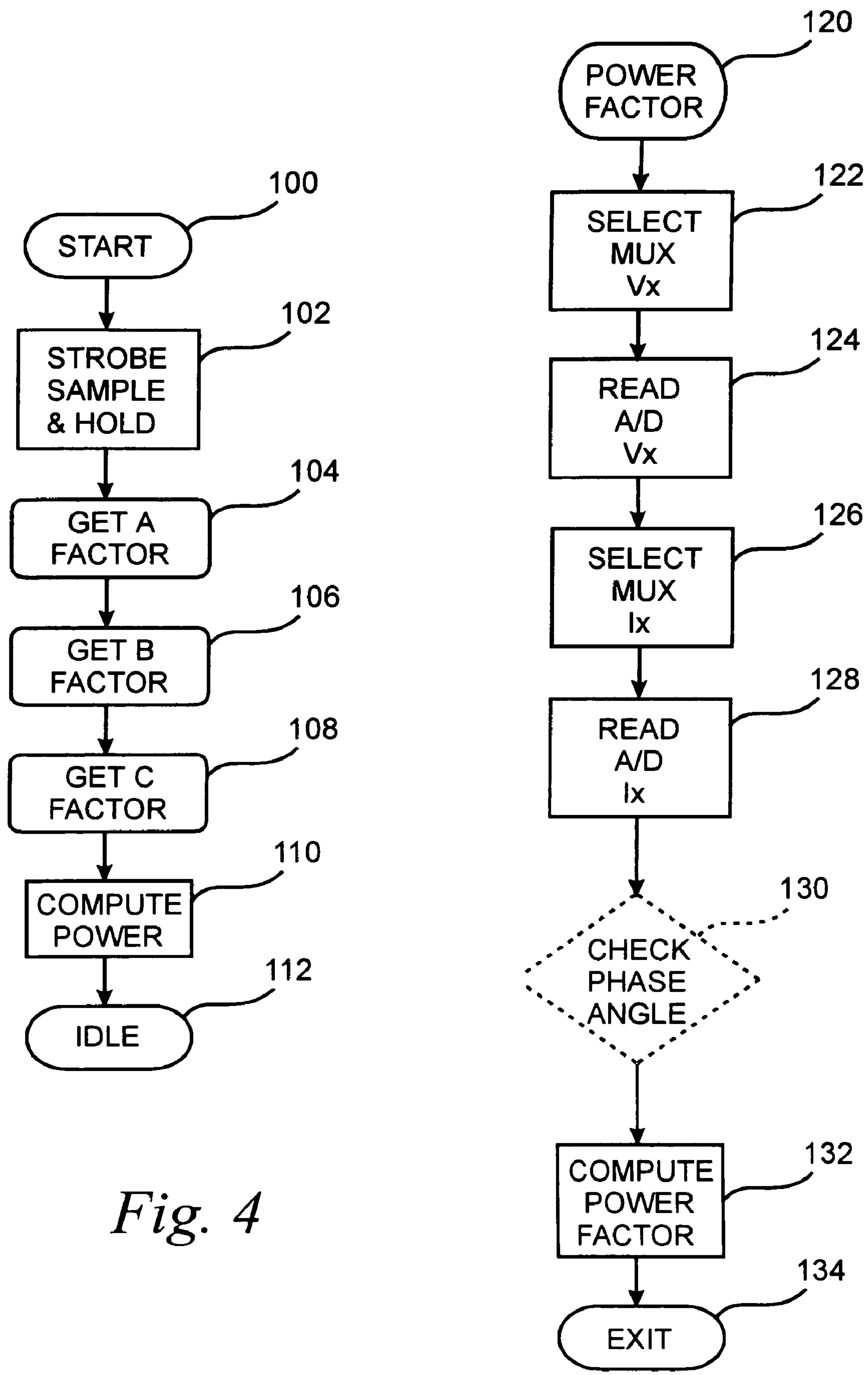
FIG. 4 is a flow chart diagram of the steps to obtain a power reading from a three-phase power circuit, in accordance with a specific embodiment of the present invention.

FIG. 4 depicts a flowchart for obtaining a power reading on a three-phase (A,B,C) power circuit using the system 8 shown in FIG. 1. The main routine is entered at step 100 which may occur by command or by a timer. At step 102, the N-way sample and hold circuits 14*a* and 14*b* are strobed by the processor 30 to obtain a snapshot of the voltage and current readings of the signals present in the voltage dividers 10 and the current transformers 12 at a specific instant of time.

At step 104, the power factor for phase A is determined by calling the power factor subroutine, steps 120-134, which is described in more detail below. The power factor subroutine returns the power factor for phase A, which may be stored in a memory location. This power factor A corresponds to the power factor for the voltage/current channel pairs from the voltage dividers 10 and the current transformers 12, i.e. V1/I1.

At step 106, the power factor for phase B is determined in a similar manner, except that the parameter B is passed as an argument to the power factor subroutine. The power factor B may also be stored in a memory location, and corresponds to the power factor for V2/I2.

At step 108, the power factor for phase C is determined by passing the parameter C to the power factor subroutine. The power factor C may be stored in a memory location, and corresponds to the power factor for V3/I3.

At step 10 the power of the three-phase circuit is calculated using the computed power factors for phases A, B, and C. In an embodiment, the routine is idled at step 112 until a timer restarts the cycle at step 100. In an alternate embodiment, the routine continually cycles, passing control from step 112 to step 100.

The power factor subroutine is initiated at step 120, and receives as parameters the addresses of the voltage/current pair (e.g., the address of V1 and the address of I1) to be analyzed. In one embodiment, the system 8 has already determined that one or more wiring errors has occurred, and instructs the multiplexer 22 to adjust the addresses so that the readings are made in the proper order. In another embodiment, such as at power-up after the system 8 has been wired up, the system 8 has not yet determined whether a wiring error has occurred, and must therefore check the phase-angle relationships of each voltage/current pair to determine whether an adjustment in the analog multiplexer 28 is necessary. In yet another embodiment, the system 8 periodically or at predetermined intervals checks the phase relationships to verify they are not outside of expected ranges.

At step 122, the analog multiplexer 22 selects the address of the voltage line V1-VN corresponding to the phase parameter to be analyzed. For example, to analyze phase B, the address corresponding to voltage line V2 is selected by the multiplexer 22 under command of the processor 30. If a wiring error has been previously detected, a different address may be selected. For example, if V1 and V2 were reversed, the address of V2 actually corresponds to the voltage line V1. In such a case, the processor 30 would instruct the multiplexer 22 to select the address corresponding to voltage line V1 in order to compute the power factor for phase B.

As described in connection with FIG. 1, the multiplexer 22 receives the signal corresponding to the voltage channel held by the sample and hold circuit 14*a* and provides the resulting signal to the gain/filter stage 24. The amplified signal is sampled by the sample and hold circuit 26 and digitized by the ADC 28. The digital signal is provided to the processor 30 in step 124. The resulting voltage sample may be stored in a memory location.

Similarly, at step 126 the processor 30 instructs the analog multiplexer 22 to select the address of the current line I1-IN corresponding to the phase parameter to be analyzed. The analog multiplexer 28 reads the current channel corresponding to the phase to be analyzed from the sample and hold circuit 14*b*, and provides that signal to the gain/filter stage 24. The resulting signal is amplified and digitized by the ADC 28 and provided to the processor 30 in step 128. The resulting current sample may be stored in a memory location.

The processor 30 applies a Fast Fourier Transform algorithm on the voltage and current samples to obtain their phase angles. At step 130, the processor optionally checks the relationship of the phase angles. As noted above, the expected power factor on each phase is assumed to be within certain bounds, normally about 0.5 leading or about 0.8 leading to about 0.5 lagging. If the relationship is outside of an expected range, then a wiring error or other circuit failure may be indicated.

In the preceding description, the addresses of the voltage/current pairs is assumed and those addresses are passed to the power factor routine steps 120-134 as arguments. In the case of a wiring error, the error can be detected at optional step 130 and a new current line address I1-IN can be tried until a reading is obtained indicating a proper phase relationship. In such a case, the addresses of the voltage/current pairs are modified such that the voltage/current phases are in their proper relationship. For example, in the wiring, error described in connection with FIG. 3, steps 104, 106, 108 would call the power factor routine with the voltage/current address arguments of V1/I1, V2/I3 and V3/I2 respectively. In this manner, although the I2 and I3 lines are swapped, the data nonetheless arrives in the memory map in the expected sequence. The power factor subroutine is exited at step 134.

The invention generally may be used in meters or other devices which monitor electricity or quantities with known phase relationships such as power systems. The invention offers greater flexibility in auto configuration or self correction for wiring errors without causing downtime to the end user. While a 3-phase power system has been described herein, it is understood that the system 8 can be extended to any number of inputs which have fixed phase relationships.

As indicated above, the invention may have other uses or advantages as well. For example, rather than correcting for incorrect wiring sequences, the invention may be used to automatically configure any given wire sequence to a desired input sequence and any type of metering or monitoring situation where the quantities to be monitored have known phase or relationships which can be detected by the monitoring process. In addition, the invention advantageously can solve for problems of coupling between channels.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A method for detecting a wiring error in an electrical circuit monitored by a power-monitoring system, comprising:

addressing an analog multiplexer under control of a processor according to a first address to select a first input carrying an analog voltage signal from said electrical circuit monitored by said power-monitoring system;

addressing said analog multiplexer according to said first address to select a second input carrying an analog current signal corresponding to said analog voltage signal;

calculating the power factor corresponding to said analog voltage signal and said analog current signal;

comparing said power factor with an expected power factor range; and changing said first address associated with said first input or said second input to a second address in response to said comparing when said power factor exceeds said expected power factor range such that said second address differs from said first address.

2. The method of claim 1, wherein said calculating is carried out using a Fast Fourier Transform algorithm.

3. The method of claim 1, wherein said expected power factor range is substantially 0.8 leading to substantially 0.5 lagging.

4. The method of claim 1, wherein said expected power factor range is substantially 0.5 leading to substantially 0.5 lagging.

5. The method of claim 1, further comprising storing a value indicative of one of said analog voltage signal and said analog current signal in a memory.

6. The method of claim 1, further comprising:

calculating the displacement angles of the respective phases corresponding to said analog voltage signal and said analog current signal;

determining whether the displacement angle corresponding to said analog voltage signal is within a first expected range; and determining whether the displacement angle corresponding to said analog current signal is within a second expected range.

7. The method of claim 6, further comprising indicating a wiring error when the displacement angle corresponding to said analog voltage signal is substantially 120 degrees outside of an expected value.

8. The method of claim 6, further comprising indicating a wiring error when the displacement angle corresponding to said analog current signal is substantially 180 degrees outside of an expected value.

9. A method for detecting and correcting wiring errors in a poly-phase electrical circuit, comprising:

receiving an equal number of voltage inputs and current inputs corresponding to analog voltage signals and analog current signals, respectively;

associating each of said inputs with an address that is provided to an analog multiplexer to select one of said inputs according to a predetermined sequence, said analog multiplexer providing an output signal corresponding to the selected input;

digitizing said output signal;

calculating a power factor corresponding to a pair of output signals, one output signal corresponding to one of said voltage inputs and the other output signal corresponding to one of said current inputs; and changing at least one of the addresses associated with one of said pair of signals when said power factor exceeds an expected power factor range to cause said analog multiplexer to select said inputs according to a new sequence that differs from said predetermined sequence.

10. The method of claim 9, wherein said poly-phase electrical circuit is a three-phase electrical circuit.

11. The method of claim 9, wherein said equal number is three.

12. The method of claim 9, wherein said digitizing is carried out using an analog-to-digital converter, said analog-to-digital converter and said analog multiplexer being components of an integrated circuit.

13. The method of claim 9, wherein said calculating is carried out using a Fast Fourier Transform algorithm.

14. The method of claim 9, wherein said associating and said changing are carried out using a processor coupled to said analog multiplexer.

15. The method of claim 9, further comprising receiving an input corresponding to a neutral or ground signal, said analog multiplexer being adapted to select a channel corresponding to said neutral or ground signal.

16. A method for detecting a wiring error, comprising:

receiving an equal number of voltage inputs and current inputs corresponding to analog voltage signals and analog current signals, respectively, from an electrical circuit monitored by a power monitoring system;

associating, under control of a processor, each of said inputs with an address according to a predetermined sequence having a first order;

addressing an analog multiplexer under control of the processor to select a first of said inputs carrying an analog voltage signal according to said address;

addressing the analog multiplexer to select a second of said inputs carrying an analog current signal according to said address;

wherein said analog multiplexer provides respective output signals corresponding to the selected first and second inputs;

digitizing said output signals;

calculating, in said processor, a power factor corresponding to said output signals, one of said output signals corresponding to said first input and another of said output signals corresponding to said second input;

comparing said power factor with an expected power factor range; and changing at least one of the addresses associated with one of said pair of signals when said power factor exceeds said expected power factor range to cause said analog multiplexer to select said inputs according to a new sequence having a second order that differs from said first order.

* * * * *